United States Patent
Cheng et al.

(10) Patent No.: US 9,269,634 B2
(45) Date of Patent: *Feb. 23, 2016

(54) SELF-ALIGNED METAL GATE CMOS WITH METAL BASE LAYER AND DUMMY GATE STRUCTURE

(75) Inventors: Kangguo Cheng, Guilderland, NY (US); Bruce B. Doris, Brewster, NY (US); Ying Zhang, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 496 days.

This patent is subject to a terminal disclaimer.

(21) Appl. No.: 13/108,138

(22) Filed: May 16, 2011

(65) Prior Publication Data

US 2012/0292710 A1 Nov. 22, 2012

(51) Int. Cl.
  *H01L 21/8238* (2006.01)
  *H01L 29/66* (2006.01)
  *H01L 29/78* (2006.01)

(52) U.S. Cl.
  CPC .. *H01L 21/823842* (2013.01); *H01L 29/66545* (2013.01); *H01L 29/7833* (2013.01); *H01L 29/7843* (2013.01); *H01L 2924/13085* (2013.01); *H01L 2924/13092* (2013.01)

(58) Field of Classification Search
  CPC ............... H01L 29/66545; H01L 21/823842; H01L 29/7843; H01L 29/7833; H01L 2924/13085; H01L 2924/13092
  USPC .................. 438/592, 585, 199, 283; 257/369, 257/E27.062
  See application file for complete search history.

(56) References Cited

U.S. PATENT DOCUMENTS

| | | | |
|---|---|---|---|
| 5,024,962 A | 6/1991 | Murray et al. | |
| 5,486,482 A | 1/1996 | Yang | |
| 5,518,938 A | 5/1996 | Yang | |
| 5,523,246 A | 6/1996 | Yang | |
| 6,033,963 A | 3/2000 | Huang et al. | |
| 6,204,103 B1 | 3/2001 | Bai et al. | |
| 6,214,670 B1 | 4/2001 | Shih et al. | |
| 6,291,282 B1 | 9/2001 | Wilk et al. | |
| 6,303,418 B1 * | 10/2001 | Cha et al. | 438/199 |
| 6,392,280 B1 | 5/2002 | Besser et al. | |
| 6,436,840 B1 | 8/2002 | Besser et al. | |
| 6,440,867 B1 | 8/2002 | Besser et al. | |
| 6,440,868 B1 | 8/2002 | Besser et al. | |
| 6,444,512 B1 | 9/2002 | Madhukar et al. | |
| 6,528,362 B1 | 3/2003 | Besser et al. | |
| 6,545,324 B2 | 4/2003 | Madhukar et al. | |
| 6,573,134 B2 | 6/2003 | Ma et al. | |
| 6,589,866 B1 | 7/2003 | Besser et al. | |
| 6,613,626 B1 | 9/2003 | Hsu | |
| 6,624,043 B2 | 9/2003 | Hsu | |
| 6,642,590 B1 | 11/2003 | Besser et al. | |

(Continued)

*Primary Examiner* — John P Dulka
(74) *Attorney, Agent, or Firm* — Scully Scott Murphy and Presser; Frank Digiglio

(57) ABSTRACT

A semiconductor device is formed by first providing a dual gate semiconductor device structure having FET pair precursors, which includes an nFET precursor and a pFET precursor, wherein each of the nFET precursor and the pFET precursor includes a dummy gate structure. At least one protective layer is deposited across the FET pair precursors, leaving the dummy gate structures exposed. The dummy gate structure is removed from one of the nFET precursor and the pFET precursor to create therein one of an nFET gate hole and a pFET gate hole, respectively. A fill is deposited into the formed one of the nFET gate hole and the pFET gate.

19 Claims, 11 Drawing Sheets

(56) References Cited

U.S. PATENT DOCUMENTS

| | | |
|---|---|---|
| 6,653,698 B2 | 11/2003 | Lee et al. |
| 6,696,345 B2 | 2/2004 | Chau et al. |
| 6,762,469 B2 | 7/2004 | Mocuta et al. |
| 6,794,281 B2 | 9/2004 | Madhukar et al. |
| 6,846,734 B2 | 1/2005 | Amos et al. |
| 6,873,048 B2 | 3/2005 | Gao et al. |
| 6,894,353 B2 | 5/2005 | Samavedam et al. |
| 6,916,698 B2 | 7/2005 | Mocuta et al. |
| 6,998,686 B2 | 2/2006 | Chau et al. |
| 7,029,966 B2 | 4/2006 | Amos et al. |
| 7,056,782 B2 | 6/2006 | Amos et al. |
| 7,109,079 B2 | 9/2006 | Schaeffer, III et al. |
| 7,176,537 B2 | 2/2007 | Lee et al. |
| 7,316,950 B2 | 1/2008 | Park et al. |
| 7,326,610 B2 | 2/2008 | Amos et al. |
| 2002/0068394 A1* | 6/2002 | Tokushige et al. ............ 438/183 |
| 2006/0071285 A1* | 4/2006 | Datta et al. .................... 257/407 |
| 2007/0077765 A1* | 4/2007 | Prince et al. .................. 438/694 |
| 2007/0138570 A1* | 6/2007 | Chong et al. .................. 257/371 |
| 2008/0248649 A1* | 10/2008 | Adetutu et al. ............... 438/692 |
| 2009/0057769 A1* | 3/2009 | Wei et al. ...................... 257/369 |
| 2010/0124818 A1* | 5/2010 | Lee et al. ...................... 438/589 |
| 2011/0248359 A1* | 10/2011 | Hwang et al. ................. 257/410 |
| 2012/0220113 A1* | 8/2012 | Liao et al. ..................... 438/585 |
| 2012/0248507 A1* | 10/2012 | Liu et al. ....................... 257/288 |
| 2012/0256276 A1* | 10/2012 | Hwang et al. ................. 257/410 |
| 2012/0264279 A1* | 10/2012 | Lu et al. ........................ 438/585 |

* cited by examiner

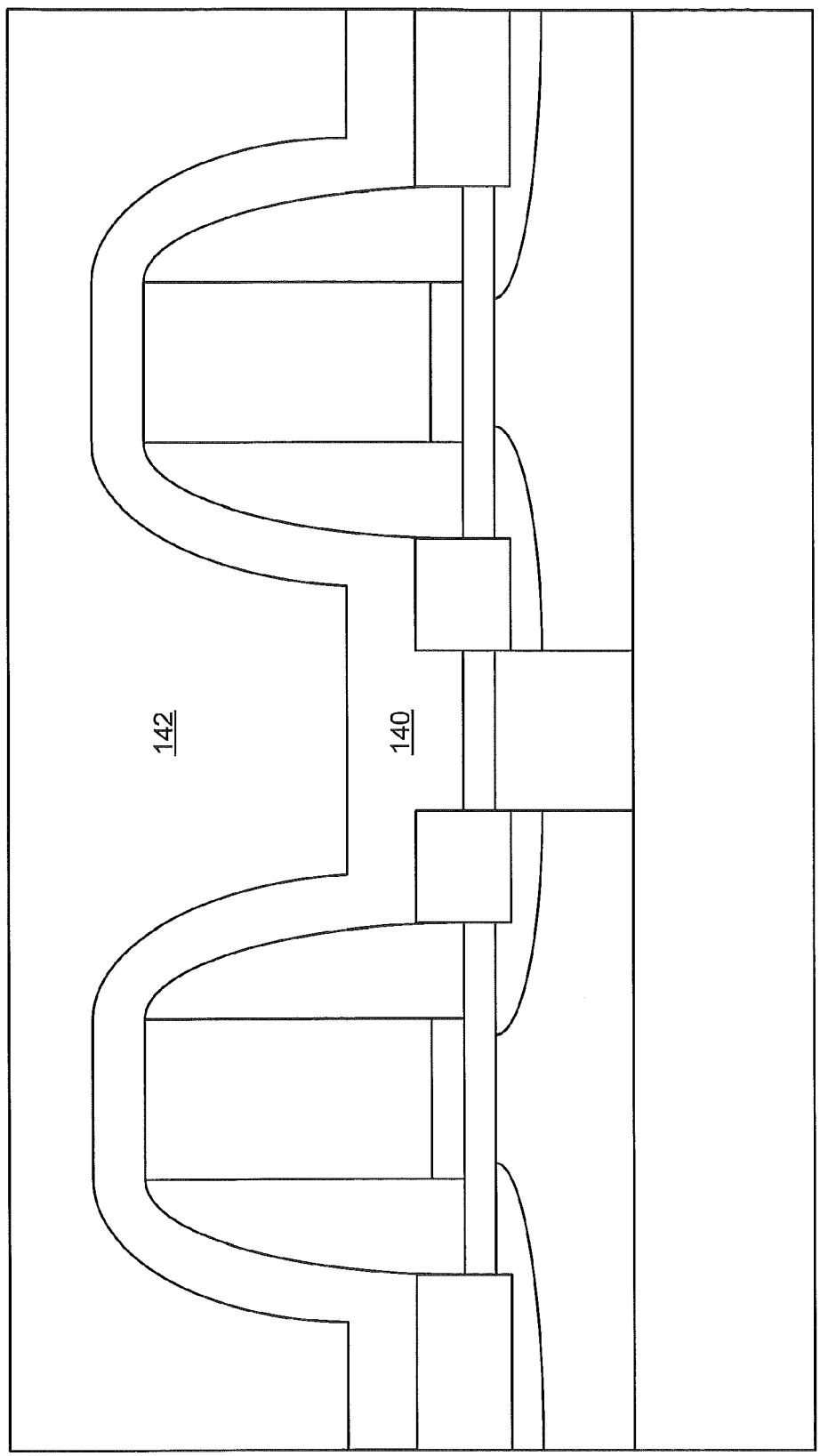

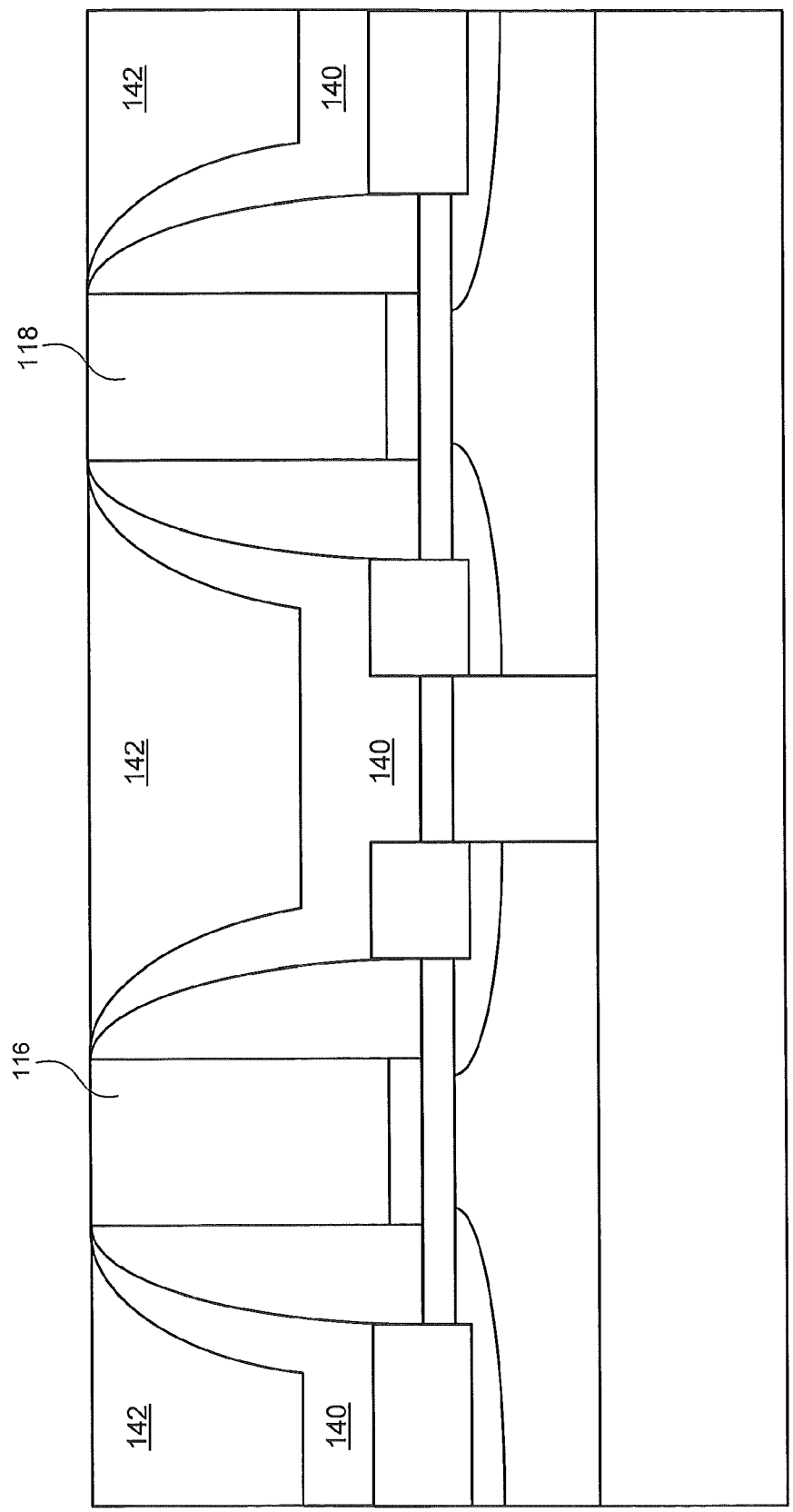

SELF-ALIGNED METAL GATE CMOS WITH METAL BASE LAYER AND DUMMY GATE STRUCTURE

BACKGROUND OF THE INVENTION

1. Field of the Invention

The field of the present invention is semiconductor fabrication, particularly CMOS semiconductor fabrication in which preformed dummy gates are selectively removed.

2. Background

One major drawback of fabricating metal gate CMOS semiconductors using replacement gate or semi-replacement gate methods is the challenges presented by ground rule requirements. Specifically, the n to p spacing, in an SRAM for example, makes removing the dummy gate from one FET while being selective to the other FET difficult at best. However, even with these challenges, certain CMOS fabrication processes may find replacement gate or semi-replacement gate methods advantageous, thereby enabling removal of the dummy gate from one FET while being selective of the other FET.

SUMMARY OF THE INVENTION

The present invention is directed toward a method of forming a semiconductor device in which preformed dummy gates are selectively removed and intermediate semiconductor device products. The semiconductor device includes precursors to a FET pair, and may be a dual gate CMOS structure. The FET pair precursors includes an nFET precursor and a pFET precursor, each of which includes a dummy gate structure. At least one protective layer is deposited across the FET pair precursors, leaving the dummy gate structures exposed. The dummy gate structure is removed from at least the nFET precursor and the pFET precursor, leaving one of an nFET gate hole and a pFET gate hole, respectively. A fill is then deposited within the formed gate hole.

As a further aspect of the method, depositing at least one protective layer may include depositing a first protective layer across the FET pair precursors, depositing a second protective layer onto the first protective layer, and then removing a portion of the first and second protective layers to expose the dummy gate structures. The first protective layer may be a SiN liner, and the second protective layer may be a high density plasma oxide.

As another further aspect of the method, the dummy gate structure of the nFET precursor may include an N-type poly Si, and the dummy gate structure of the pFET precursor may include a P-type poly Si. When removing the dummy gate structure from either of the nFET precursor and the pFET precursor, the dummy gate structure from one of the nFET precursor and the pFET precursor is selectively removed.

As another further aspect of the method, depositing the first fill may include depositing a first conformal film onto the FET pair precursors and removing a portion of the first film to expose the first fill and the dummy gate structure from the other of the nFET precursor and the pFET precursor. This aspect may be achieved by further removing the dummy gate structure from the other of the nFET precursor and the pFET precursor to create therein one of the nFET gate hole and the pFET gate hole, respectively, and depositing a second fill into one of the nFET gate hole and the pFET gate hole. A second conformal film may thereafter be deposited onto the FET pair precursors, then a portion of the second film may be removed to expose the first fill and the second fill.

As another further aspect of the invention, an oxygen treatment may be used to add $O_2$ to vacancies in a high K material, thereby providing a lower threshold voltage in a pFET by filling in the holes without changing the threshold voltage for the paired nFET.

A first intermediate semiconductor device product includes FET pair precursors disposed on a substrate. One of the FET pair precursors may be an nFET precursor, and the other may be a pFET precursor. One of the FET precursors includes a fill disposed above and in contact with its respective metal gate layer, and the other of the FET precursors includes a dummy gate structure disposed above and in contact with its respective second metal gate layer, with the fill and the dummy gate structure sharing a common interface.

A second intermediate semiconductor device product includes FET pair precursors disposed on a substrate, with one of the FET pair precursors being an nFET precursor, and the other being a pFET precursor. Each FET precursor includes spacers disposed on two sides of and extending above a gate stack. Each gate stack is topped by a metal gate layer. A fill is disposed over the pair of FET precursors and between the spacers of each FET precursor. The fill is in contact with each of the metal gate layers. This fill may also extend above the spacers and continuously between the nFET and pFET precursors. The fill may overlay at least one protective layer disposed over parts of the FET precursors, and it may be deposited as a conformal film, such as, for example, a SiN film.

Any of the above aspects of the method may be employed alone or in combination.

Accordingly, an improved method of forming a semiconductor device is disclosed. Advantages of the improvements will appear from the drawings and the description of the preferred embodiment.

BRIEF DESCRIPTION OF THE DRAWINGS

In the drawings, wherein like reference numerals refer to similar components:

FIGS. 2A-2J schematically illustrate process steps for forming the semiconductor device of FIG. 1.

DETAILED DESCRIPTION OF THE PREFERRED EMBODIMENTS

Figure 1:
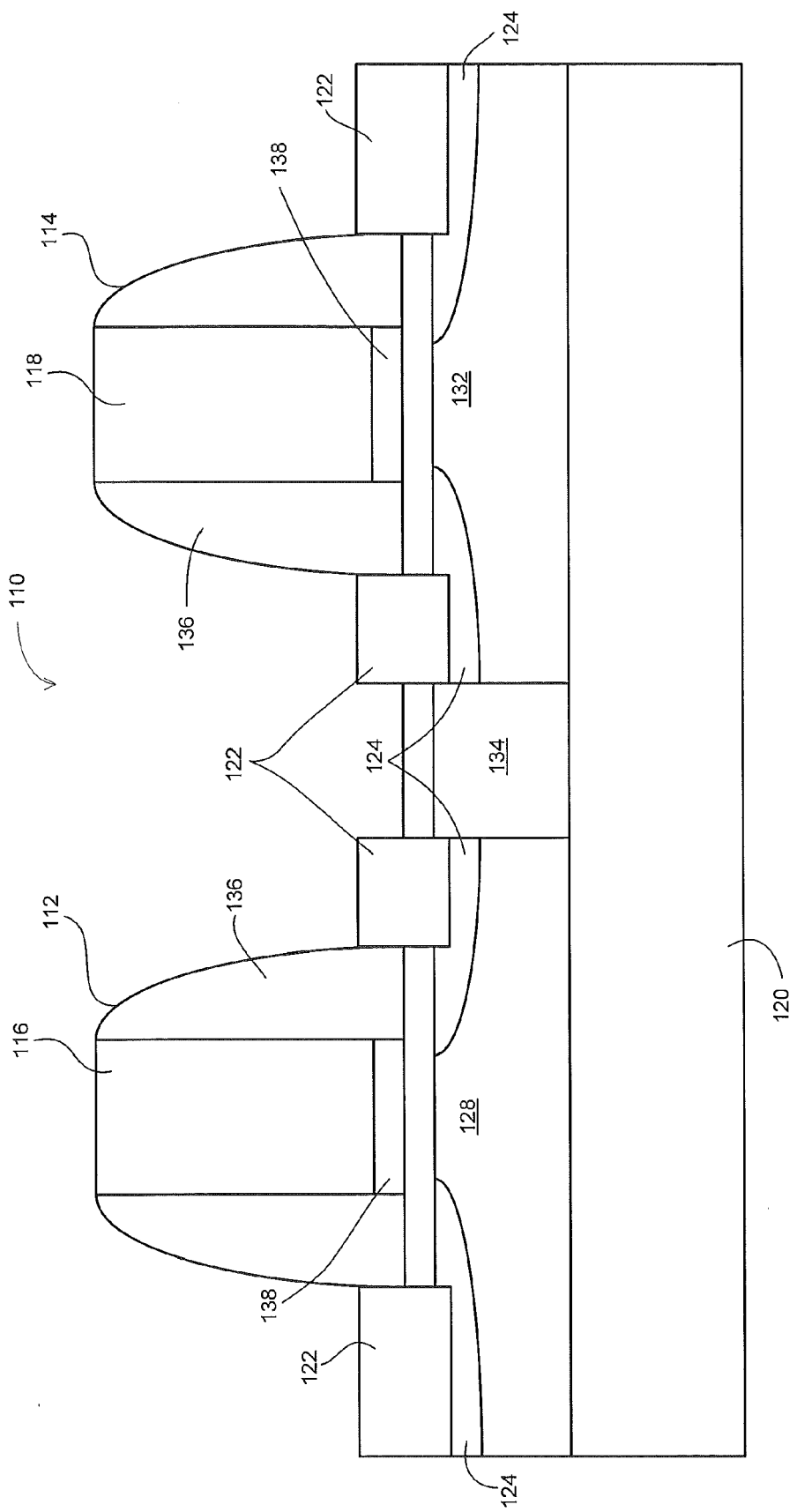
FIG. 1 schematically illustrates a semiconductor device structure of the prior art having precursors to a FET pair, which includes dummy gates in each of an nFET precursor and a pFET precursor.

Turning in detail to the drawings, FIG. 1 illustrates a conventional semiconductor device structure 110 known in the art having precursors to a FET pair, which includes both an nFET precursor 112 and a pFET precursor 114. This semiconductor device structure 110 is an intermediary product in the fabrication of metal gate CMOS semiconductors. Each of the nFET precursor 112 and the pFET precursor 114 have been prepared with dummy gates 116, 118, the nFET precursor 112 having a capping layer to adjust the nFET threshold voltage like Lanthanum Oxide or other material as is known in the art of making high k semiconductor devices, and the pFET precursor 114 having no capping. The semiconductor device structure 110 is formed on a substrate 120, which may be any suitable substrate for semiconductor-device formation, such as a conventional bulk silicon substrate, a silicon-on-insulator-type (SOI) substrate, and the like. The semiconductor device structure 110 may be used as an intermediary product in the production of a metal gate CMOS. As such, the semiconductor device structure 110 has silicide features 122 formed over source/drain portions 124 formed in the substrate 120, and the nFET precursor 112 includes an N-poly as a first dummy gate 116 formed over a P-well 128 in the substrate 120, while the pFET precursor 112 includes a P-poly as a second dummy gate 118 formed over an N-well 132 in the substrate 120. A shallow trench isolation feature 134 is included within the substrate, separating the P-well 128 and the N-well 132. Each of the nFET precursor 112 and the pFET precursor 114 include spacers 136 on either side of each dummy gate 116, 118, and a metal base layer 138 underlying each dummy gate 116, 118. The particular components and/or materials for this semiconductor device structure 110 are representative of features in CMOS products known within the prior art, and therefore may be substituted for known equivalents.

FIGS. 2A-I illustrate a stepwise process for replacing one or both of the dummy gates illustrated in the semiconductor device structure 110 of FIG. 1. Initially the semiconductor device structure 110 is exposed to a forming gas anneal. The gas mixture may be Hydrogen and Nitrogen, although other mixtures may also be used depending upon the design of the particular CMOS end product. The exposure time may be approximately 30 minutes, and the temperature of the process may be approximately 400-700° C. Again, the time and/or temperature of the forming gas anneal may vary depending upon the design of the CMOS end product.

As shown in FIG. 2A, a SiN liner 140 is then formed across both FETs, followed by a dielectric layer 142. Both the SiN liner 140 and the dielectric layer ($SiO_2$ for example) layer 142 form protective barriers over the semiconductor device structure 110, and both may be formed by any number of processes known to those of skill in the art. For example, the SiN liner 140 may be formed by plasma enhanced chemical vapor deposition PECVD and the dielectric layer 142 as $SiO_2$ may be deposited by using High Density Plasma deposition (HDP). The thickness of the SiN liner 140 may be in the range of 20 nm-50 nm, and optionally in the range of 5 nm-120 nm. The thickness of the dielectric layer 142 may be in the range of 50 nm-100 nm, and optionally in the range of 20 nm-300 nm.

Figure 2B:
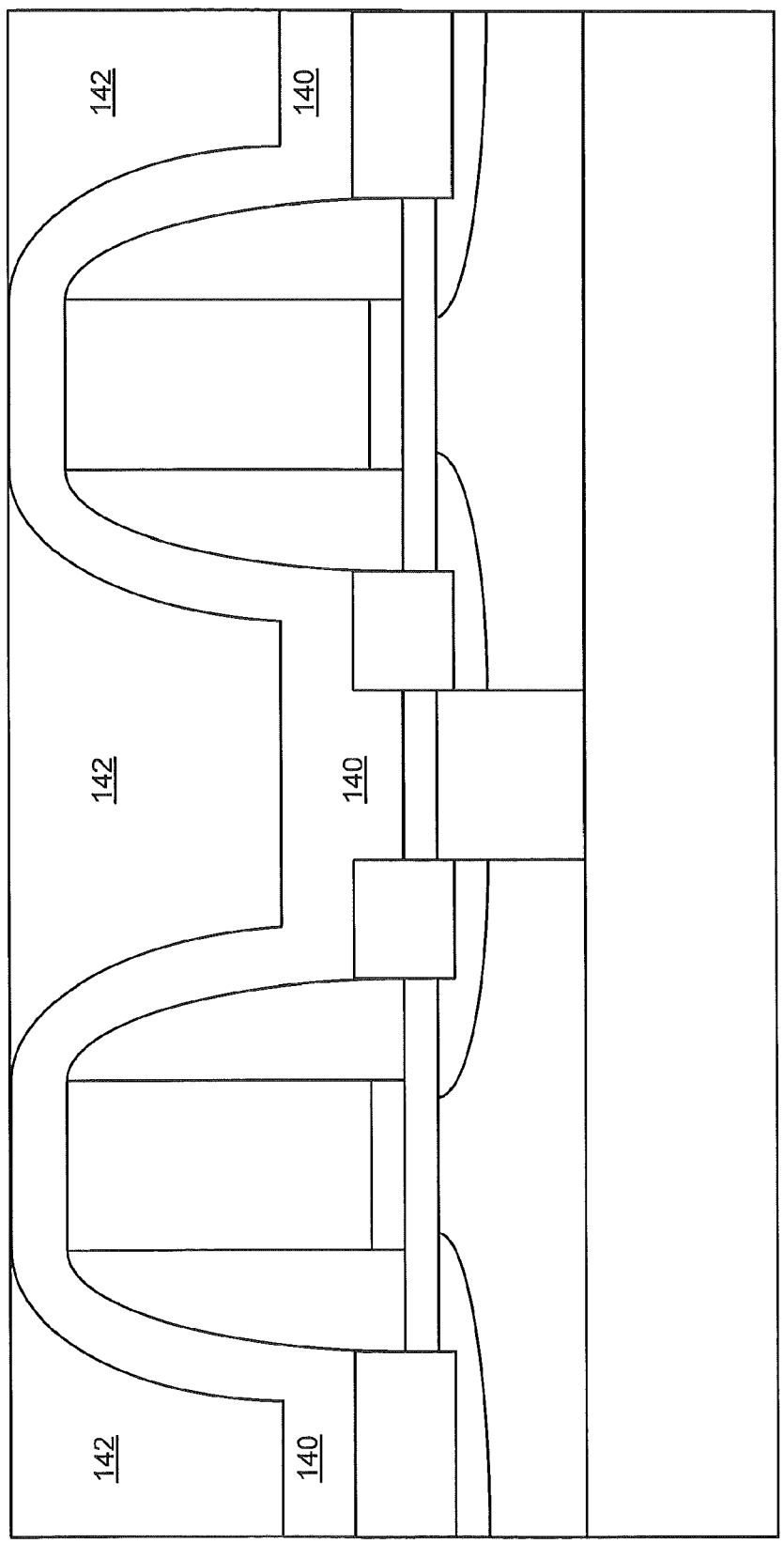

Next, as shown in FIG. 2B, the dielectric layer 142 is planarized, preferably through a chemical-mechanical planarization process, down to the upper level of the SiN liner 140. This leaves exposed the upper portion of the SiN liner 140, which is the portion disposed above each dummy gate 116, 118. As shown in FIG. 2C, the exposed portions of the SiN liner 140 are selectively etched using well-known reactive ion etching (RIE) processes to expose the two dummy gates 116, 118.

Figure 2D:
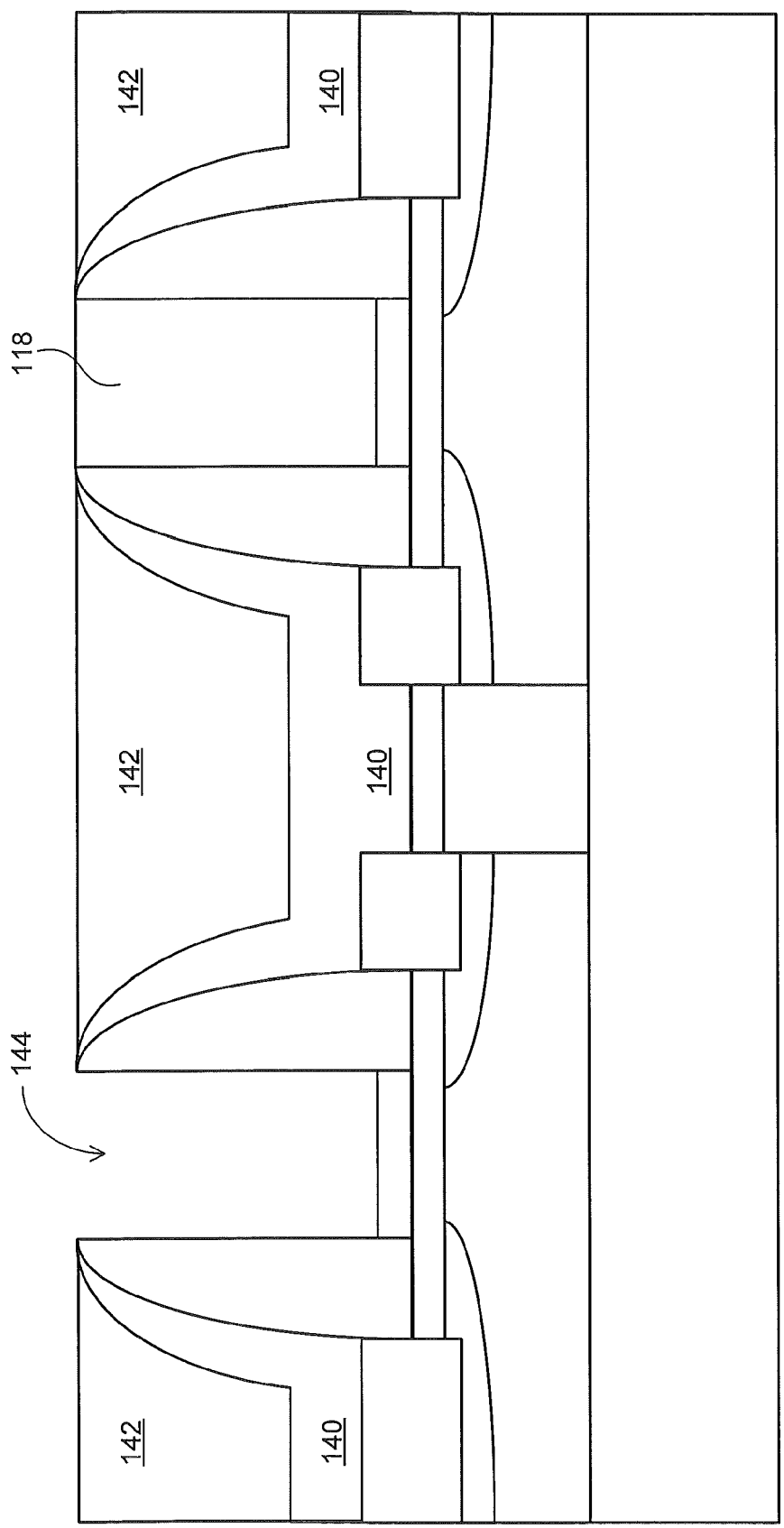

With the two dummy gates 116, 118 exposed, the N-poly is removed, as shown in FIG. 2D, in a process that is selective of the P-poly, i.e., the removal processes do not interact with the P-poly. This removal process leaves an nFET gate hole 144 in the space previously occupied by the N-poly. Alternatively, those skilled in the art will recognize that the P-poly could be removed at this step, with the N-poly being removed subsequently. Removal of the N-Poly stops at the N-metal base layer 138, which will form the base layer of any eventual metal gate that is deposited through subsequent processing after one or both dummy gates are removed. The N-poly may be removed using an etch chemistry, such as $NH_4OH$ or TMAH, or any other chemistry that is selective of P-poly, i.e., acts upon the N-poly, but not upon the P-poly.

Figure 2E:
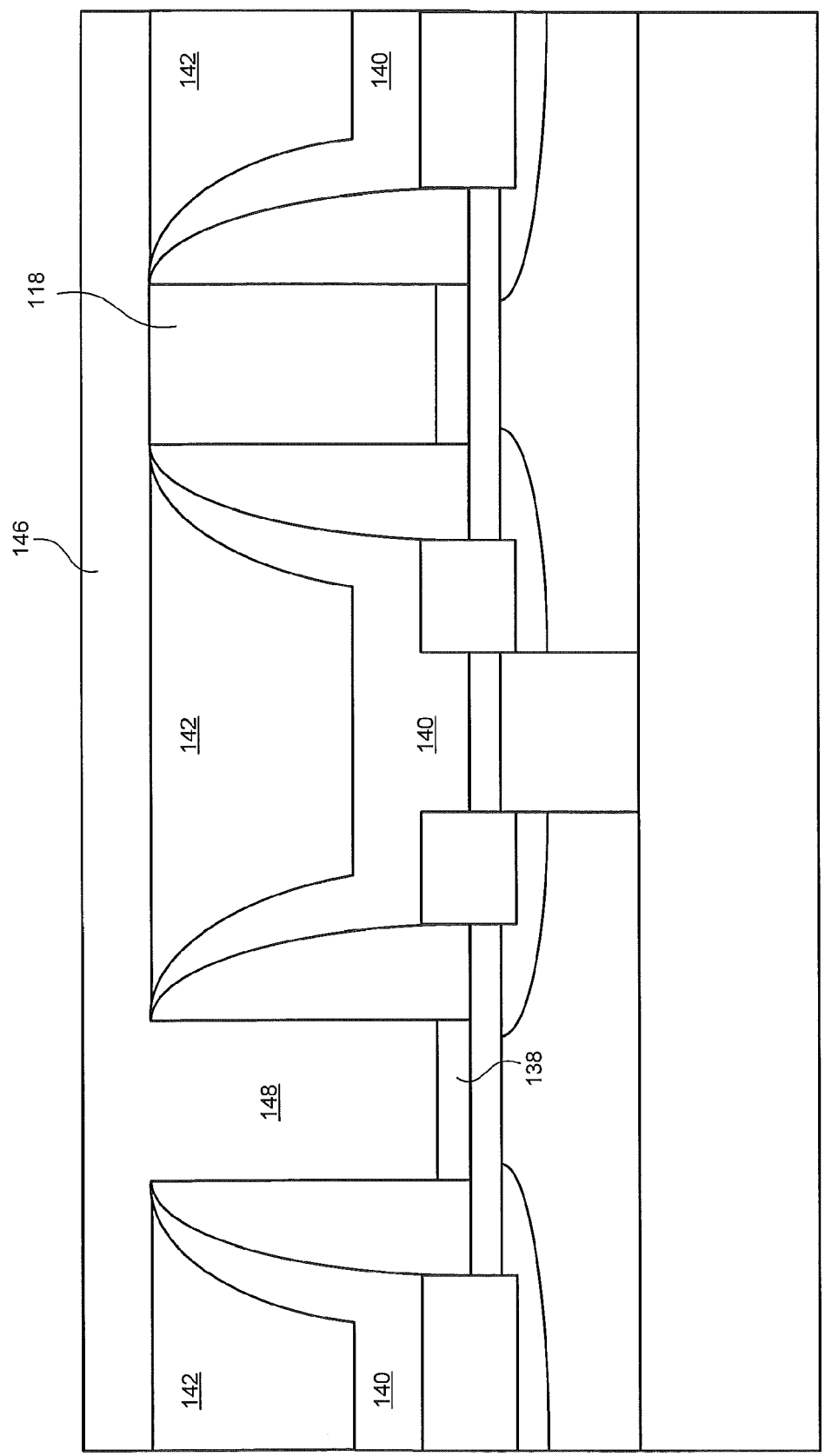
Figure 2F:
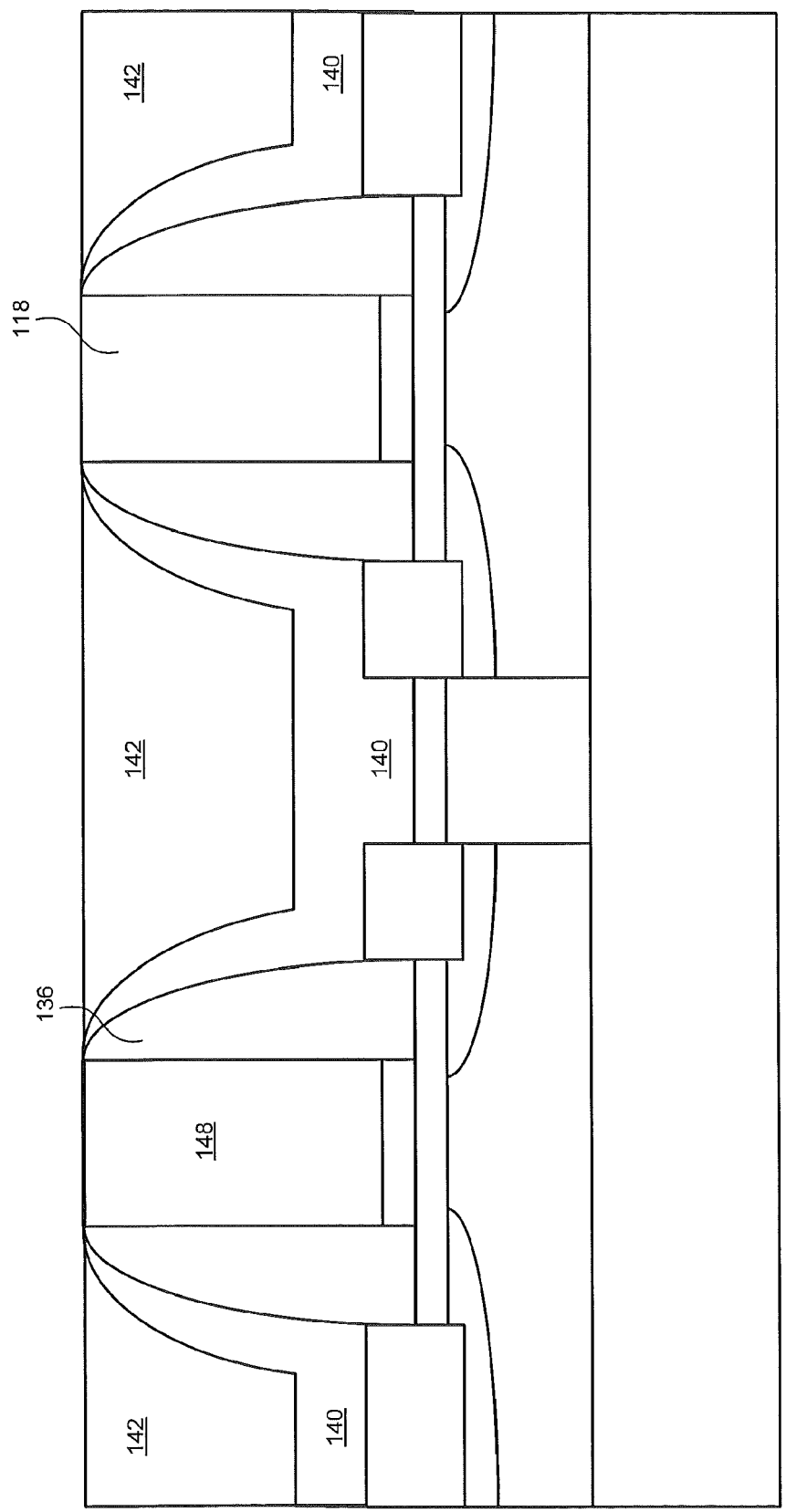
Figure 2G:
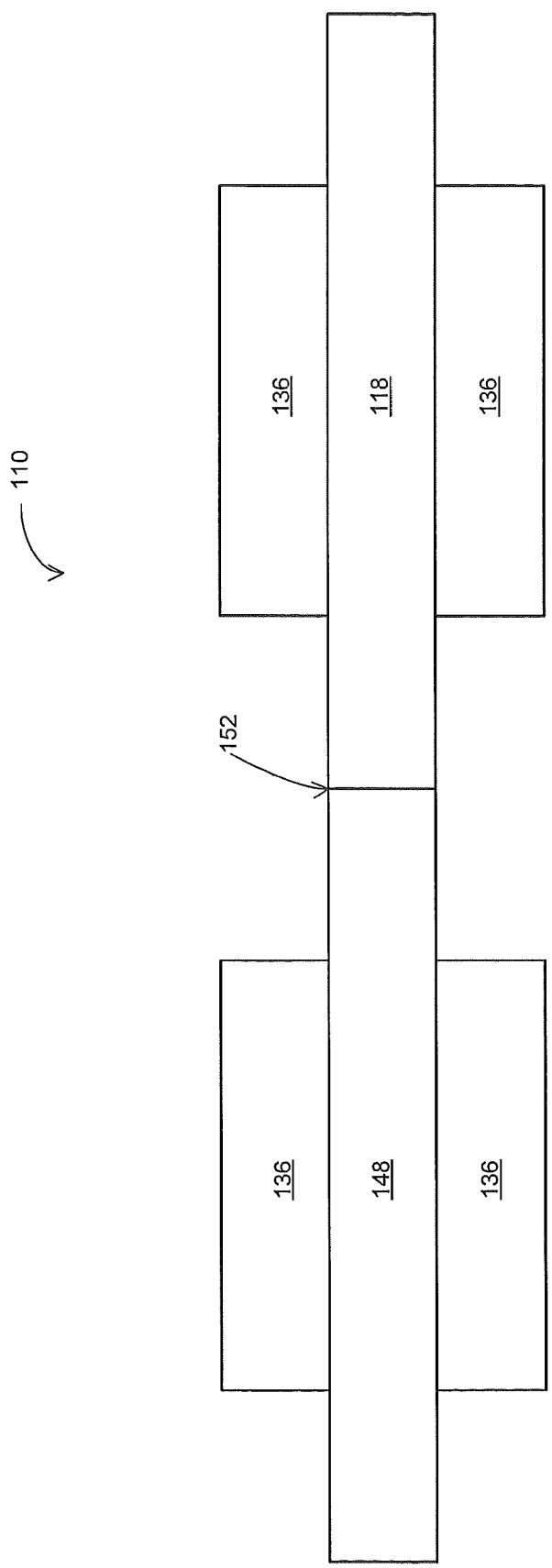

A conformal SiN film 146 is then deposited on the semiconductor device structure 110, thereby depositing a SiN fill 148 in the nFET gate hole 144, as shown in FIG. 2E. Next, the conformal SiN is etched, preferably using RIE processes, to remove the SiN film down to the level of the remaining dummy gate, which is shown in FIG. 2F as the P-poly dummy gate 118, leaving behind the SiN fill 148 between the gate spacers 136 of the nFET precursor 112. FIG. 2G shows the semiconductor device structure 110 at this stage of the processing in a top-down view as a first intermediate device product. As can be seen, the SiN fill 148 in the nFET gate hole 144 shares a common interface 152 with the P-poly dummy gate 118. As will be recognized by those of skill in the art, this configuration is unique and may enable as yet unrealized processing options.

Figure 2H:
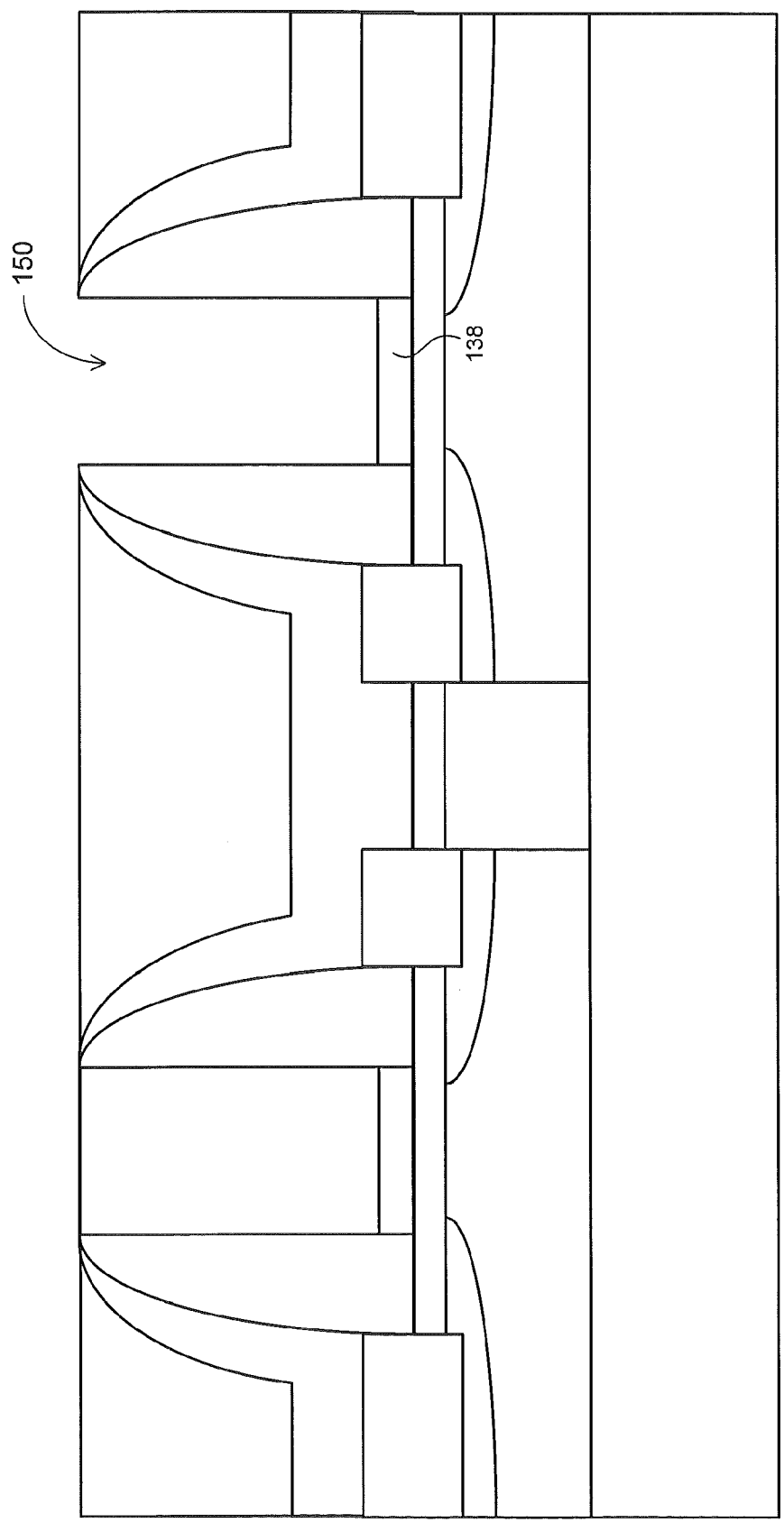

At this stage, the other dummy gate, shown as the P-poly dummy gate in FIG. 2F, is exposed and may be removed by processes selective of the SiN fill 148. As indicated above, the N-poly could be removed at this stage, if the P-poly was previously removed. This removal process leaves a pFET gate hole 150 in the space previously occupied by the P-poly, as shown in FIG. 2H. Again, removal of the P-poly stops at the P-metal base layer 138, which will form the base layer of any eventual metal gate that is deposited through subsequent processing. The P-poly may be removed using a dry etch chemistry, such as HBr, or any other chemistry that is selective of the SiN fill previously deposited in the nFET precursor 112. Following formation of the pFET gate hole 150, an oxidation treatment may be applied to the semiconductor device structure 110. As is well-known in the art, an oxidation treatment may be used to add $O_2$ to vacancies in a high K material, thereby providing a lower threshold voltage in a pFET by filling in the oxygen vacancies. By performing the oxidation treatment at this stage, the threshold voltage of the pFET that is eventually formed may be lowered without changing the threshold voltage for the nFET that is eventually formed from these precursors. The oxygen content of the treatment gas and exposure time may vary depending upon the design needs for the finished CMOS end product. However, since the process disclosed herein results in an intermediary product, the gas mixture and exposure time will generally be addressed based on design needs determined at the time of process implementation.

Figure 2I:
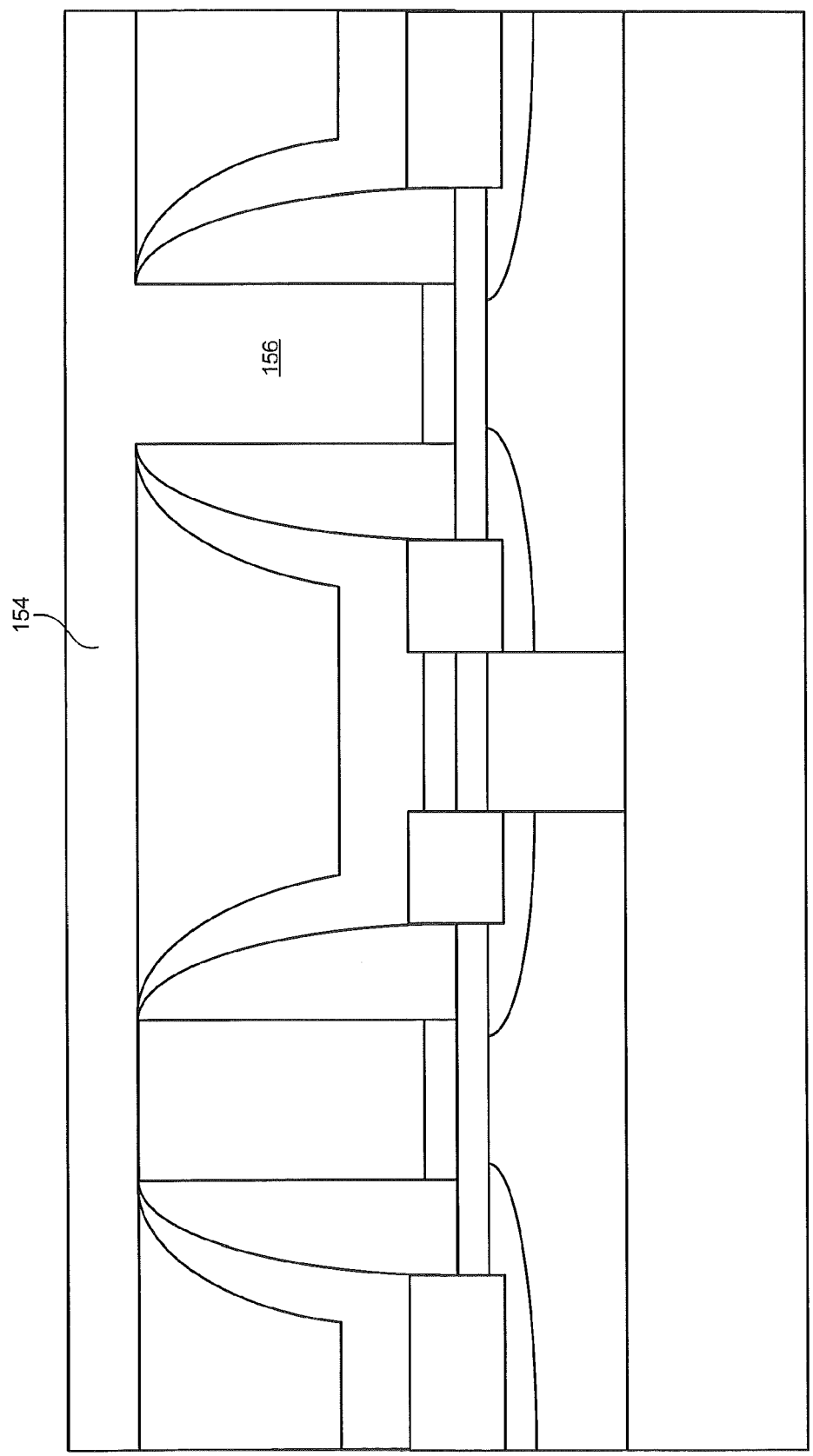

A conformal SiN film 154 is again deposited on the semiconductor device structure 110, thereby depositing an SiN fill 156 in the pFET gate hole, as shown in FIG. 2I. Each gate hole is now filled with an SiN fill, and the SiN film overlays the entire semiconductor device structure. Thus, the semiconductor device shown in FIG. 2I may be beneficially used as another intermediate semiconductor device product because it has the SiN film as a protective layer overlying the entire structure. The protective layer enables further processing options as will be recognized by those of skill in the art.

As a final step in the preferred process, the conformal SiN is etched, preferably using RIE processes, to remove the SiN film 154 down to the level of the gate spacers 136, leaving the SiN fill 156 between the gate spacers 136 of the pFET precursor 114.

Figure 2J:
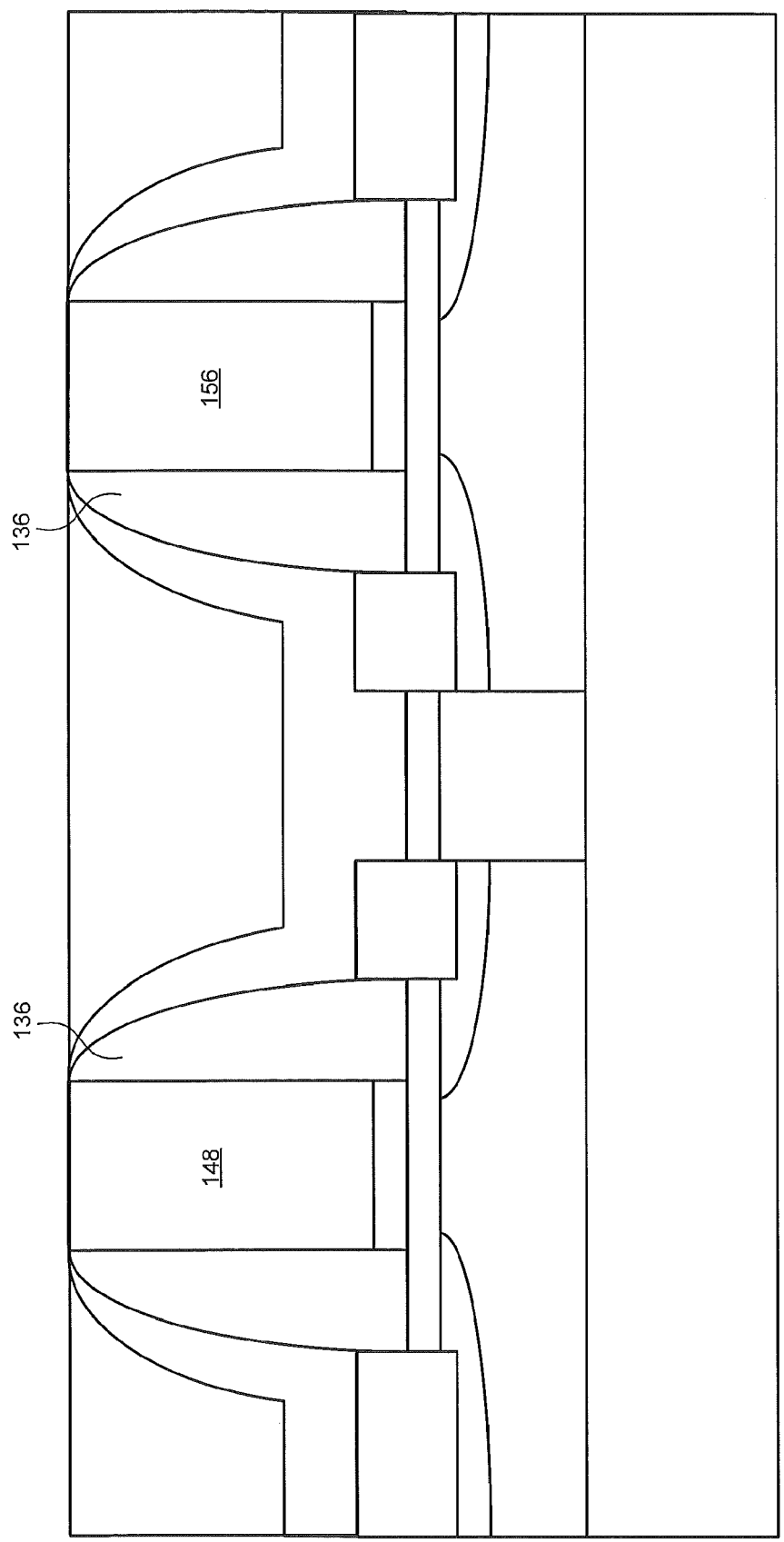

The semiconductor device structure 110 resulting from this final step is shown in FIG. 2J. This semiconductor device structure 110 may be used as an intermediary for fabrication of a CMOS as an end product. When used as such, the SiN fills 148, 156 may be removed by known processes and gate structures may be deposited and/or formed to achieve the desired finished product. This self-aligned process described above enables the removal of nFET and pFET dummy gates independently, which is expected to result in improved work function control for pFETs and reduced parasitic capacitances for both FETs. In addition, the process flow enables an enhanced stress effect by removing the dummy gates after front end of the line processing.

Thus, a method of forming a semiconductor device is disclosed. While embodiments of this invention have been shown and described, it will be apparent to those skilled in the art that many more modifications are possible without departing from the inventive concepts herein. The invention, therefore, is not to be restricted except in the spirit of the following claims.

What is claimed is:

1. A method for forming a semiconductor device, comprising:
   forming an N-field effect transistor (NFET) gate region and a P-field effect transistor (PFET) gate region, wherein each gate region comprises a metal base layer and a dummy gate structure formed on the metal base layer, wherein the dummy gate structure of the NFET gate region comprises an N-type polysilicon (N-poly) material, wherein the dummy gate structure of the PFET gate region comprises a P-type polysilicon (P-poly) material, and wherein sidewall spacers are formed on sidewalls of the dummy gate structures of the NFET gate region and the PFET gate region;
   depositing a silicon nitride (SiN) liner over the NFET and PFET gate regions;
   depositing a dielectric layer over the SiN liner;
   etching the dielectric layer and the SiN liner to expose the dummy gate structure of the NFET region and the dummy gate structure of the PFET region;
   removing the dummy gate structure of the NFET gate region selective to the dummy gate structure of the PFET gate region, thereby forming an NFET gate hole which exposes the metal base layer of the NFET gate region; and
   filling the NFET gate hole with SiN material.

2. The method of claim 1, wherein the removing of the dummy gate structure of the NFET gate region selective to the dummy gate structure of the PFET gate region comprises etching the N-poly material selective to the P-poly material.

3. The method of claim 2, wherein the N-poly is selectively etched using a wet-etch process.

4. The method of claim 1, wherein the etching of the dielectric layer and the SiN liner to expose the dummy gate structure of the NFET region and the dummy gate structure of the PFET region comprises:
   planarizing the dielectric layer down to the SiN liner, thereby exposing portions of the SiN liner disposed above and aligned to the dummy gate structures; and
   etching the exposed portions of the SiN liner selective to the dielectric layer to expose the dummy gate structures.

5. The method of claim 1, wherein the filling of the NFET gate hole with SiN material comprises:
   depositing a conformal SiN layer until the NFET gate hole is filled with SiN material; and
   etching down the conformal SiN layer to expose the dummy gate structure of the PFET region.

6. The method of claim 1, wherein the dielectric layer comprises a high-density plasma oxide.

7. The method of claim 1, wherein the depositing of the SiN liner over the NFET and PFET gate regions comprises depositing a conformal SiN liner layer using a chemical vapor deposition process.

8. The method of claim 1, wherein the dielectric layer is formed with a thickness in a range of 50 nm to 100 nm.

9. The method of claim 1, further comprising:
   removing the dummy gate structure of the PFET gate region selective to the SiN material filling the NFET gate hole, thereby forming a PFET gate hole which exposes the metal base layer of the PFET gate region; and
   filling the PFET gate hole with SiN material.

10. The method of claim 9, further comprising performing an oxidation treatment before the filling of the PFET gate hole with SiN material, wherein the oxidation treatment results in lowering a threshold voltage of a subsequently formed PFET device.

11. A method for forming a semiconductor device, comprising:
    forming an N-field effect transistor (NFET) gate region and a P-field effect transistor (PFET) gate region, wherein each gate region comprises a metal base layer and a dummy gate structure formed on the metal base layer, wherein the dummy gate structure of the NFET gate region comprises an N-type polysilicon (N-poly) material, wherein the dummy gate structure of the PFET gate region comprises a P-type polysilicon (P-poly) material, and wherein sidewall spacers are formed on sidewalls of the dummy gate structures of the NFET gate region and the PFET gate region;
    depositing a silicon nitride (SiN) liner over the NFET and PFET gate regions;
    depositing a dielectric layer over the SiN liner;
    etching the dielectric layer and the SiN liner to expose the dummy gate structure of the NFET region and the dummy gate structure of the PFET region;
    removing the dummy gate structure of the PFET gate region selective to the dummy gate structure of the NFET gate region, thereby forming a PFET gate hole which exposes the metal base layer of the PFET gate region; and
    filling the PFET gate hole with SiN material.

12. The method of claim 11, further comprising performing an oxidation treatment before the filling of the PFET gate hole with SiN material, wherein the oxidation treatment results in lowering a threshold voltage of a subsequently formed PFET device.

13. The method of claim 11, wherein the removing of the dummy gate structure of the PFET gate region selective to the dummy gate structure of the NFET gate region comprises etching the P-poly material selective to the N-poly material.

14. The method of claim 11, wherein the etching of the dielectric layer and the SiN liner to expose the dummy gate structure of the NFET region and the dummy gate structure of the PFET region comprises:
    planarizing the dielectric layer down to the SiN liner, thereby exposing portions of the SiN liner disposed above and aligned to the dummy gate structures; and
    etching the exposed portions of the SiN liner selective to the dielectric layer to expose the dummy gate structures.

15. The method of claim 11, wherein the filling of the PFET gate hole with SiN material comprises:
    depositing a conformal SiN layer until the PFET gate hole is filled with SiN material; and
    etching down the conformal SiN layer to expose the dummy gate structure of the NFET region.

16. The method of claim 11, wherein the dielectric layer comprises a high-density plasma oxide.

17. The method of claim 11, wherein the depositing of the SiN liner over the NFET and PFET gate regions comprises depositing a conformal SiN liner layer using a chemical vapor deposition process.

18. The method of claim 11, wherein the dielectric layer is formed with a thickness in a range of 50 nm to 100 nm.

19. The method of claim 11, further comprising:
removing the dummy gate structure of the NFET gate region selective to the SiN material filling the PFET gate hole, thereby forming an NFET gate hole which exposes the metal base layer of the NFET gate region; and
filling the NFET gate hole with SiN material.

\* \* \* \* \*